United States Patent [19]

Shirata et al.

[11] Patent Number: 5,074,953
[45] Date of Patent: Dec. 24, 1991

[54] METHOD FOR MONOCRYSTALLINE GROWTH OF DISSOCIATIVE COMPOUND SEMICONDUCTORS

[75] Inventors: Keiji Shirata; Koichi Sassa; Kenji Tomizawa, all of Omiya, Japan

[73] Assignee: Mitsubishi Materials Corporation, Tokyo, Japan

[21] Appl. No.: 395,724

[22] Filed: Aug. 18, 1989

[30] Foreign Application Priority Data

Aug. 19, 1988 [JP] Japan .................. 63-205861
Aug. 19, 1988 [JP] Japan .................. 63-205863

[51] Int. Cl.⁵ .............................. C30B 15/20
[52] U.S. Cl. ...................... 156/601; 156/7; 156/617.1; 156/618.1; 156/620.2; 156/DIG. 70; 422/112; 422/249
[58] Field of Search ............... 136/601, 607, 617.1, 136/618.1, 620.2, DIG. 70; 422/112, 249

[56] References Cited

U.S. PATENT DOCUMENTS

| | | | |
|---|---|---|---|
| 4,008,387 | 2/1977 | Green et al. | 422/249 |
| 4,032,389 | 6/1977 | Joyce | 156/601 |
| 4,565,598 | 1/1986 | Seymour | 156/601 |
| 4,586,979 | 5/1986 | Katsumata et al. | 156/601 |
| 4,596,700 | 6/1986 | Tada et al. | 422/249 |
| 4,704,257 | 3/1987 | Tomizawa et al. | 422/249 |

FOREIGN PATENT DOCUMENTS

| | | | |
|---|---|---|---|
| 2516197 | 10/1976 | Fed. Rep. of Germany | 156/601 |
| 58-135626 | 8/1983 | Japan | 156/607 |
| 60-255692 | 12/1985 | Japan | 156/617.1 |
| 61-205697 | 9/1986 | Japan | 156/617.1 |
| 62-7695 | 1/1987 | Japan | 156/617.1 |

OTHER PUBLICATIONS

Bardsley et al., "The Weighing Method of Automatic Czochralski Crystal Growth", Journal of Crystal Growth, vol. 40, No. 1 (1977), pp. 21 to 28.

Primary Examiner—Robert Kunemund
Attorney, Agent, or Firm—Cushman, Darby & Cushman

[57] ABSTRACT

The present invention relates to a method and apparatus for mono-crystalline growth of a dissociative compound semiconductor. The method, which is based on the Czochralski method, includes the following steps. First, a first volatile component material and second material of the dissociative compound semiconductor are prepared. The first material is placed on the bottom of an inner air-tight vessel which is contained in an outer air-tight vessel. The second material is contained in a crucible supported in the inner vessel by a lower shaft extending from the inside to the outside of the inner vessel. The first material is, next, heated for evaporating so as to react with the second material. Therefore, the dissociative compound semiconductor is synthesized in the crucible. Then, temperature of a furnace installed on the inner vessel is adjusted so that the pressure of the gas of the first volatile component material in the inner vessel is controlled. A single crystal is pulled up from the melt by an upper shaft extending from inside to outside of the inner vessel, thereby the single crystal is grown. The improvement is that the pulling-up step includes the steps of: measuring the weight of the growing crystal, the weight influenced by a difference between the interior pressure of the inner vessel and a pressure outside of the inner vessel; correcting the measured weight of the crystal for the error due to the pressure difference, thereby obtaining an accurate estimate of the weight of the crystal; and controlling a diameter of the growing crystal on the basis of the weight estimate of the crystal.

11 Claims, 3 Drawing Sheets

METHOD FOR MONOCRYSTALLINE GROWTH OF DISSOCIATIVE COMPOUND SEMICONDUCTORS

BACKGROUND OF THE INVENTION

The present invention relates to a method and apparatus to grow a single crystal of a dissociative compound semiconductor, controlling the pressure of a volatile component gas. Dissociative compound semiconductor includes, for example, III—V group compounds such as GaAs, InP, or GaP which are compounds of a volatile component (Vth group such as As or P) and a nonvolatile second component (IIIrd group such as Ga or In). GaAs is taken hereinafter as an example, but the present invention is possible to apply for other dissociative compounds.

Japanese Patent Application Publication (kokai) No. 60-255692 discloses an example of an apparatus which is used in the Czochralski method for mono-crystalline growth of a dissociative compound semiconductor.

With reference to FIG. 1, the apparatus of the Japanese Application Publication for mono-crystalline growth has an inner air-tight vessel constituted by an upper vessel portion 1 with an observation scope 9 and a furnace 10 for controlling arsenic gas pressure, and a lower vessel portion 2. A circumferential joint portion 3, at which the upper vessel portion 1 and lower vessel portion 2 are joined, contains sealing material 7 such as $B_2O_3$ which can be melted as a liquid seal at high temperature. Heaters 11 are installed so as to surround the air-tight vessel.

The inner vessel is supported on a pushing-up shaft 13 and a coil spring 8 which is inserted intermediately in the pushing-up shaft 13. A lower shaft 14 is installed through the pushing-up shaft 13, and has a crucible 4 which is laid on the end of the lower shaft 14. An upper shaft 5 penetrates an upper wall of the upper vessel portion 1.

Sealing portions 15 to keep the vessel air-tight are installed at a portion at which the upper shaft 5 slides through the upper vessel portion 1; and at a portion at which the lower shaft 14 slides through the lower vessel portion 2, so that the atmosphere within the inner vessel is isolated from the outer atmosphere. The sealing portions 15 consist of material such as $B_2O_3$ which can be melted at high temperature.

With such construction, gallium is placed in the crucible 4. The whole apparatus is then evacuated and the inner vessel is sealed by pushing up the lower vessel portion 2. The heaters 11 are next turned on to vaporize the arsenic. Then, the temperature of the furnace 10, at which temperature is lowest on the inner vessel wall, is adjusted so that the vessel is filled with arsenic gas at a prescribed pressure. Arsenic gas reacts with gallium in the crucible 4, thereby GaAs melt is produced in the crucible 4.

A GaAs seed fixed at an end of the upper shaft 5 is dipped into the GaAs melt. The upper shaft 5 is pulled up while rotation of the shaft 14 about its axis. Consequently, a single crystal 6 of GaAs can be obtained.

During pulling up the upper shaft 5, a load cell (not shown) which is connected to the upper shaft 5 detects the change in the weight of the single crystal 6. The change of the weight is transmitted to a computer (not shown), which controls the power of the heaters 11 so as to control the diameter of the growing single crystal.

However, in this method, the upper shaft 5 receives an extra force from the difference between the inner pressure of the air-tight vessel and the pressure of the outer atmosphere. Such pressure difference arises when the two atmospheres partitioned by the inner vessel wall can not be balanced precisely and when a small periodical change of temperature exists on the inner vessel wall. And the output signal of the load cell corresponds to the summation of the true crystal weight and the extra force due to the pressure difference. If the pressure difference fluctuates, the output signal is spoiled by noise. It therefore becomes impossible to accurately control the crystal diameter.

SUMMARY OF THE INVENTION

In order to solve such problems, it is therefore an object of the present invention to provide a method for mono-crystalline growth of a dissociative compound semiconductor with accurate diameter-control of the growing crystal, without loss of the air-tightness of the apparatus.

It is another object of the present invention to provide an apparatus for mono-crystalline growth of a dissociative compound semiconductor with accurate diameter-control of the growing crystal, without loss of the air-tightness of the apparatus.

According to the present invention, the method for monocrystaline growth of dissociative compound semiconductor, which is based on the Czochralski method, includes the following steps.

First, a first volatile component material and second material of the dissociative compound semiconductor are prepared. The first material is placed on the bottom of an air-tight vessel. The second material is contained in a crucible in the air-tight vessel. The crucible is supported by a lower shaft extending from the inside to the outside of the air-tight vessel.

The first material is, next, heated for evaporating so as to react with the second material in the crucible. Therefore, the dissociative compound semiconductor is synthesized in the crucible.

Then, temperature of a furnace installed on the air-tight vessel is adjusted so that the pressure of the gas of the first volatile component material in the air-tight vessel is controlled.

A single crystal is pulled up from the melt by an upper shaft extending from inside to outside of the air-tight vessel, thereby the single crystal is grown.

The improvement is that the pulling-up step includes the steps of: measuring the weight of the growing crystal, the weight influenced by a difference between the interior pressure of the inner vessel and a pressure outside of the inner vessel; correcting the measured weight of the crystal for the error due to the pressure difference, thereby obtaining an accurate estimate of the weight of the crystal; and controlling a diameter of the growing crystal on the basis of the weight estimate of the crystal.

The apparatus of the present invention for monocrystaline growth of dissociative compound semiconductor comprises an outer air-tight vessel having a top and bottom wall.

An inner air-tight vessel is placed in the outer vessel. The inner vessel has a top and bottom wall.

A furnace is installed on the inner air-tight vessel for controlling pressure of a gas of a first volatile component material of the dissociative compound semiconductor.

A lower shaft of a circular cross section penetrates air-tightly the bottom walls of the outer and inner vessels in a vertical direction. The lower shaft which has an axis in a vertical direction is movable in a vertical direction and rotatable about the axis thereof.

A crucible, for containing a second material, in which a melt of the dissociative compound is synthesized by reaction with said gas of said first material, is disposed in the inner vessel and supported by the lower shaft.

Heating means are installed, which are adequate to give a desirable temperature distribution on the inner vessel wall.

An upper shaft penetrates air-tightly the top walls of the outer and inner vessels in a vertical direction above the crucible, for pulling the single crystal upward from the melt of the dissociative compound, thereby growing the single crystal. The upper shaft which is of a circular cross section having an axis in a vertical direction is movable in a vertical direction and rotatable about the axis thereof.

A first load cell is disposed on the outer vessel for detecting the weight of the growing crystal. The weight is influenced by a difference between the interior pressure of the inner vessel and the pressure outside of the inner vessel.

A second load cell is disposed on the outer vessel for correcting the weight of the growing crystal for the error due to the pressure difference.

According to the present invention, the first load cell detects the weight of the growing crystal influenced by the difference between the interior pressure of the inner vessel and the pressure outside of the inner vessel. The second load cell corrects the measured weight for the pressure difference. Therefore, the weight of the growing crystal is corrected to an accurate value. Then, the diameter of the growing crystal can be controlled accurately and automatically by controlling the power of the heating means in a feed-back way on the basis of the accurate weight-value.

DETAILED DESCRIPTION OF THE PREFERRED EMBODIMENTS

Various preferred embodiments of the present invention will be described hereinafter with reference to the accompanying drawings.

FIRST EMBODIMENT

Figure 1:
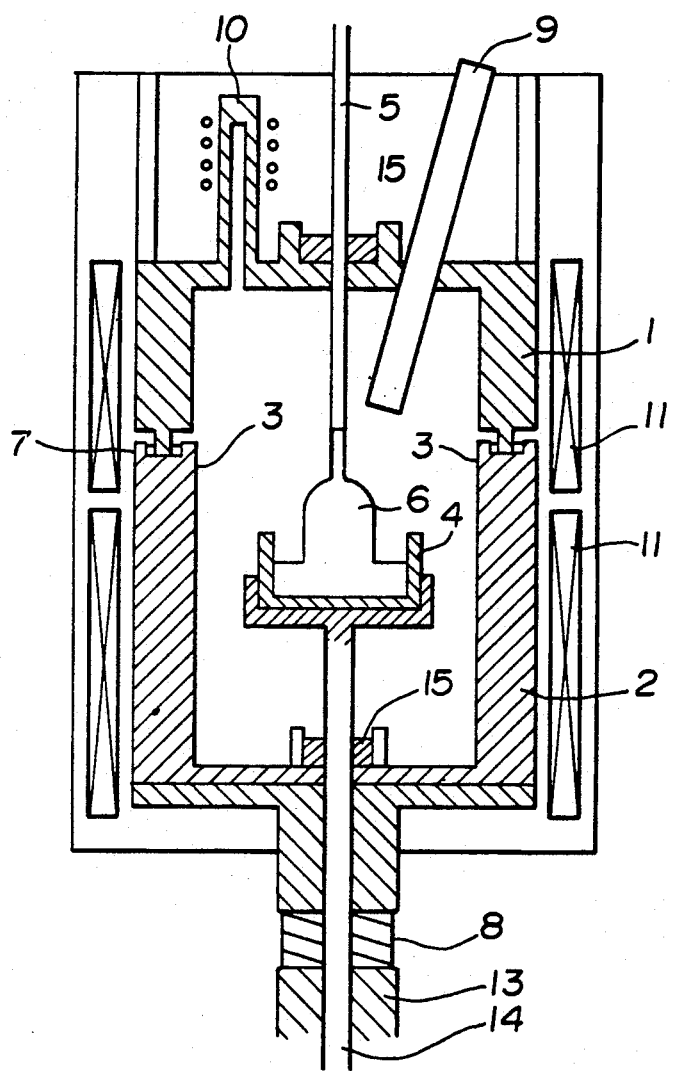
FIG. 1 is a side elevation showing an apparatus of prior art.
Figure 2:
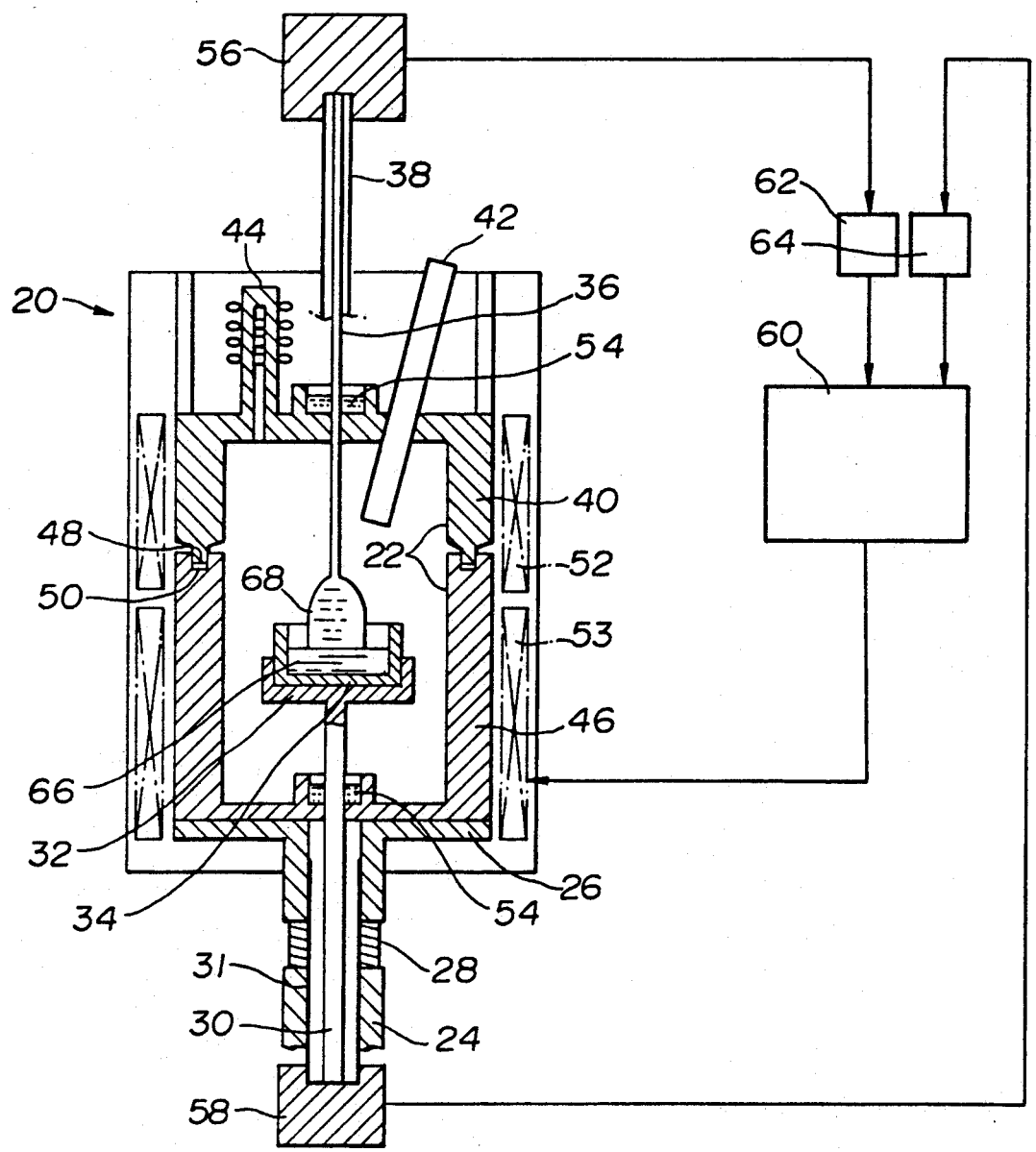
FIG. 2 is a side elevation showing an apparatus of a first embodiment of the present invention.

FIG. 2 depicts an apparatus used for growth of a single crystal of a dissociative compound semiconductor according to a first embodiment of the present invention.

The apparatus comprises an outer vessel 20 closed air-tightly and an inner vessel 22 contained in the outer vessel 20.

The inner vessel 22 is constituted by an upper vessel portion 40 which is installed with an observation scope 42 and a furnace 44 for controlling the arsenic gas pressure, and a lower vessel portion 46. The inner vessel 22 is also closed air-tightly with pushing up the lower vessel portion 46 which is movable in a vertical direction, and joinning a joint portion 48 which will be described later on.

A through-hole is formed through a bottom wall of the outer vessel 20. A pushing-up shaft 24 with a flange portion 26 to move the lower portion 46 of the inner vessel 22 is installed in the vertical line in such a manner that a rod portion thereof is inserted slidably and air-tightly in the through-hole of the outer vessel 20; and the flange portion 26 is disposed under the lower portion 46 of the inner vessel 22. The pushing-up shaft 24 has a spring suspension mechanism 28 intermediating in the rod portion thereof.

A lower shaft 30, which is surrounded by a sheath 31, is also inserted through the pushing-up shaft 24 therealong. The lower shaft 30 further extends into the inside of the inner vessel 22 and supports a receptacle 32 which holds a crucible 34. The crucible 34 is able to be located in a desirable position in the inner vessel 22, from the point of view of temperature distribution.

An upper shaft 36 surrounded by a sheath 38 is installed in the vertical line so as to penetrate air-tightly a top (not shown) of the outer vessel 20. An end of the upper shaft 36 extends into the inside of the inner vessel 22.

A circumferential joint portion 48, at which the upper vessel portion 40 and lower vessel portion 46 are joined, contains a sealing material 50 such as $B_2O_3$ which can be melted as a liquid seal at high temperature. Upper and lower heaters 52 and 53 are installed in the outer vessel 20 so as to surround the inner vessel 22.

Sealing portions 54 to give the inner vessel 22 airtight seals for the movable shafts 30 and 36 are installed at a portion at which the upper shaft 36 slides through the upper vessel portion 40; and at a portion at which the lower shaft 30 slides through the lower vessel portion 46. The sealing portions 54 are also of material such as $B_2O_3$ which can be melted at high temperature. Therefore, the upper shaft 36 and the lower shaft 30 can rotate and move along a vertical direction freely keeping the inner vessel air-tight.

An upper load cell (first load cell) 56 is connected to the upper shaft 36 and the housing of the upper load cell 56 is connected to the sheath 38. Similarly, a lower load cell (second load cell) 58 is connected to the lower shaft 30 and the housing of the lower load cell 58 is connected to the sheath 31. The upper and lower load cells 56 and 58 are connected to a computer 60 via A/D converters 62 and 64, respectively.

Therefore, output signals of the upper and lower load cells 56 and 58 are transmitted to the A/D converters 62 and 64, and converted to digital signals by the A/D converters 62 and 64. The digital signals are received by the computer 60 which calculates the weight of the growing crystal. The computer 60 controls the power of the lower heater 53 so as to control the crystal-diameter.

In the above-construction, both of the upper shaft 36 and lower shaft 30 are of circular cross-sections, but have different diameters.

With such construction, gallium is placed in the crucible 34 and solid arsenic is placed on the bottom of lower vessel portion 46. The whole apparatus is then evacuated. The joint portion 48 is made tight by pressing up the lower vessel portion 46 so as to make inner vessel isolated from the outer atmosphere.

Then, the lower heater 53 and upper heater 52 are turned on to increase the temperature to vaporize the arsenic gas. At the same time, the temperature of the furnace 44 is adjusted so that the inner vessel 22 is filled with arsenic gas at a prescribed pressure, while the outer vessel 20 is filled with an inert gas at a prescribed pressure for balancing the pressure within the inner vessel 22. Arsenic gas reacts with gallium in the crucible 34, thereby GaAs melt 66 is synthesized in the crucible 34.

A GaAs seed fixed at the lower end of the upper shaft 36 is dept into the melt 66. The upper shaft 36 is pulled, with rotation about its axis. Consequently, a single crystal 68 of GaAs can be grown.

During pulling the upper shaft 36 upward, the load cell 56 connected to the upper shaft 36 detects the change of weight of the single crystal 68. At that time, the load cell 58 connected to the lower shaft 30 detects the change of weight of the GaAs melt 66. The changes of the weight signals are transmitted to the computer 60, which makes feed-back control of the power of the lower heater 53 so as to control the diameter of the growing single crystal.

With such a method, the disadvantage of the conventional method, that is, the inaccuracy in the measurement of the weight of the growing crystal, caused by the difference between the pressure in the inner vessel and the pressure in the outer atmosphere, is solved, so that the diameter of the growing single crystal of the compound semiconductor is accurately controlled.

The principle of the method is represented by the following formulae:

$$W_1 = w_1 + \Delta P \times \pi \times R_1^2 \quad (1)$$

$$W_2 = w_2 - \Delta P \times \pi \times R_2^2 \quad (2)$$

where $\Delta P$ is the pressure difference, $R_1$ is the radius of the upper shaft 36, $R_2$ is the radius of the lower shaft 30, $W_1$ is the measured weight of the growing crystal and the tare measured by the upper load cell 56, $w_1$ is a true weight of the growing crystal and the tare, $W_2$ is the measured weight of the GaAs melt 66 and the tare measured by the lower load cell 58, and $w_2$ is a true weight of the melt and the tare. Since the sum of $w_1$ and $w_2$ is constant, the above formulae can be re-written as follows:

$$w = w_1 + w_2 \quad (3)$$

$$R_1^2 \times W_2 + R_2^2 \times W_1 = w_1 \times R_2^2 + w_2 \times R_1^2 \quad (4)$$

where w is a constant. Therefore, $$w_1 = \{(W_2 - w) \times R_1^2 + W_1 \times R_2^2\}/(R_2^2 - R_1^2) \quad (5)$$

In formula (5), $R_1$ and $R_2$ are substituted as the following formula:

$$R_2 = k \times R_1 \quad (6)$$

where k is a constant. Therefore, $$w_1 = (k^2 \times W_1 + W_2 - w)/(k^2 - 1) \quad (7)$$

Accordingly, with reference to formula (7), accurate weight $w_1$ of the growing crystal and the tare can be calculated from $W_1$ and $W_2$.

On the basis of the estimate of the weight $w_1$, the diameter of the growing single crystal can be controlled accurately and automatically by means of the computer 60 to control the power of the heater 53.

EXAMPLE 1

An experiment for growing a single crystal was done with the above apparatus with the pulling-up speed of the upper shaft 36 at 5 mm/hour, the rotation speed of the upper shaft 36 at 5 r.p.m., and the rotation speed of the lower shaft 30 at 5 r.p.m.

The produced single crystal was of a 80 mm diameter and of a 100 mm length. The deviation of the diameter was small, in a range of ±1 mm.

SECOND EMBODIMENT

Figure 3:
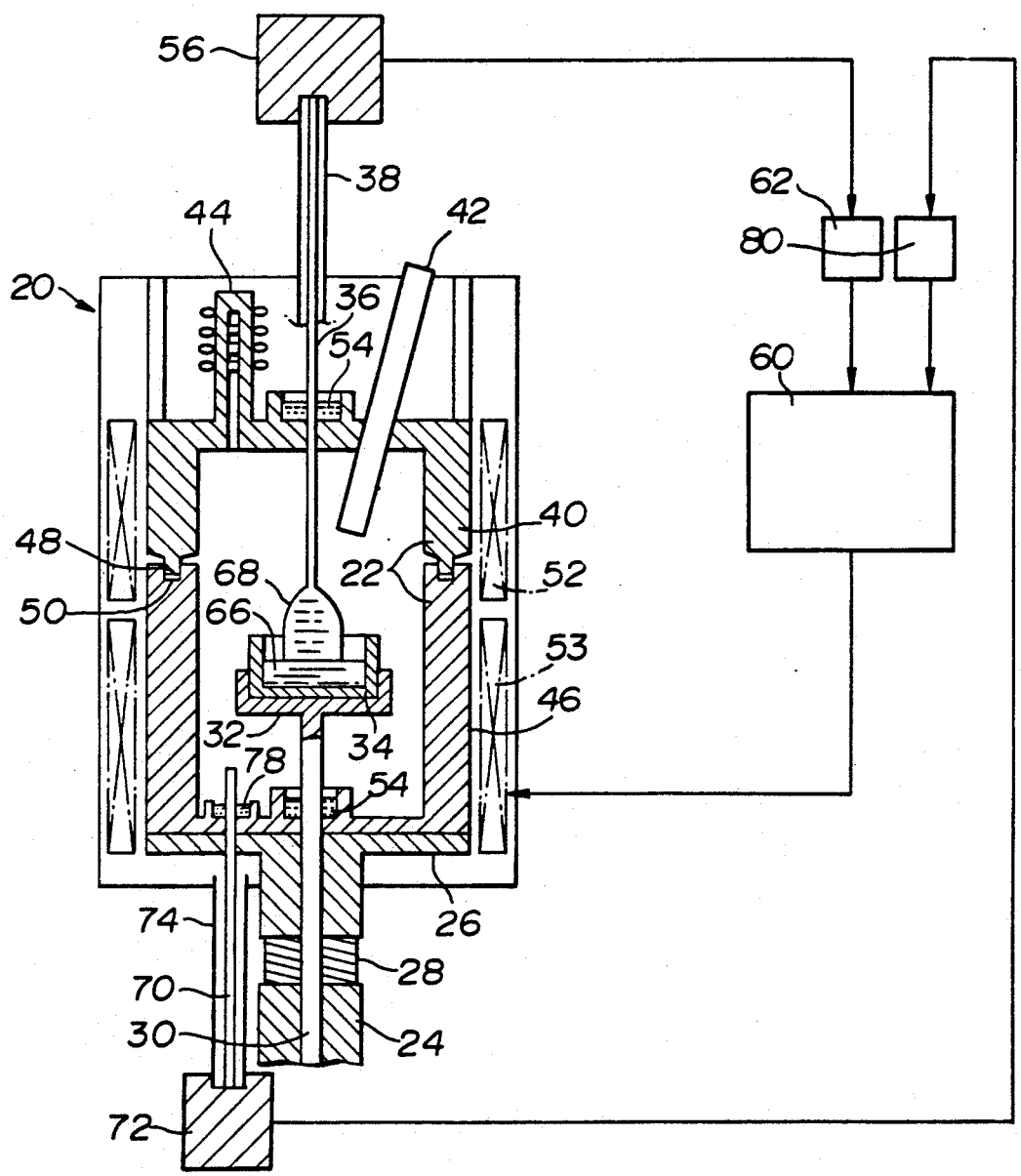
FIG. 3 is a side elevation showing an apparatus of a second embodiment of the present invention.

FIG. 3 depicts an apparatus used for growth of a single crystal of a dissociative compound semiconductor according to a second embodiment of the present invention. In FIG. 3, the same numerals are attached to the same elements as in FIG. 2, so the description of the elements is omitted.

The lower shaft 30 is also inserted through the pushing-up shaft 24 in the second embodiment, however, without the sheath 31 in FIG. 2 and is not connected to the load cell 58.

A through-hole is formed so as to penetrate through the bottom of the lower vessel portion 46, the flange portion 26 of the pushing-up shaft 24, and the bottom of the outer vessel 20. A detecting bar 70 for detecting the difference between the interior pressure of the inner vessel 22 and the atmosphere pressure is inserted in the through hole, so that the upper end of the bar 70 extends into the inside of the inner vessel 22 and the lower end of the bar 70 is connected to a second load cell 72. The housing of the second load cell 72 is linked to the outer vessel 20 with a sheath 74 in which the detecting bar 70 is inserted.

On the bottom of the lower vessel portion 46, a seal 78 is formed so as to make the detecting bar 70 air-tight and movable freely in a vertical direction as with the sealing 54.

The second load cell 72 is connected to the computer 60 via an A/D converter 80. The output signal of the load cell 72 is transmitted to the A/D converter 80, and converted to a digital signal by the A/D converter 80.

The digital signals from the A/D converter 80 and the A/D converter 62 are received by the computer 60 which calculates the weight of a growing crystal. The computer 60, which further calculates a diameter of the growing crystal on the basis of the estimate of the weight, controls the power of the heater 53 so as to control the crystal diameter.

In the above construction, both the upper shaft 36 and detecting bar 70 are of circular cross-sections; and the shaft 36 and bar 70 may have different diameters or they may have the same diameter.

With such construction, gallium is placed in the crucible 34 and solid arsenic is placed on the bottom of the lower vessel portion 46. The whole apparatus is then evacuated. The joint portion 48 is made tight by pushing up the lower vessel portion 46 so as to make inner vessel 22 isolated from the outer atmosphere.

Then, the lower heater 53 and the upper heater 52 are turned on to increase the temperature to vaporize the arsenic. At the same time, the temperature of the furnace 44 is adjusted so that the inner vessel is filled with arsenic gas at a prescribed pressure, while the outer vessel 20 is filled with an inert gas at a prescribed pressure. Arsenic gas reacts with gallium in the crucible 34, thereby GaAs melt 66 is synthesized in the crucible 34.

A GaAs seed fixed at the lower end of the upper shaft 36 is dipped into the melt 66. The upper shaft 36 is pulled upward while rotating about its axis. Consequently, a single crystal 68 of GaAs can be grown.

During the pulling the upper shaft 36 upward, the first load cell 56 connected to the upper shaft 36 detects the change of weight of the single crystal 68. At that time, the second load cell 72 connected to the detecting bar 70 detects the difference between the interior pressure of the inner vessel 22 and the atmosphere pressure. The change of the weight is transmitted to the computer 60, which makes feed-back control of the power of the lower heater 53 so as to control the diameter of the growing single crystal.

With such method, the disadvantage of the conventional method, that is, the inaccuracy in the measurement of the weight of the growing crystal, caused by the pressure difference, is solved, so that the diameter of the growing single crystal of compound semiconductor is accurately controlled.

The principle of the method is represented by the following formulae:

$$W_1 = w_1 + \Delta P \times \pi \times R_1^2 \quad (8)$$

$$W_2 = w_2 - \Delta P \times \pi \times R_2^2 \quad (9)$$

where $\Delta P$ is the pressure difference, $R_1$ is the radius of the upper shaft 36, $R_2$ is the radius of the detecting bar 70, $W_1$ is the measured weight of the growing crystal and the tare measured by the first load cell 56, $w_1$ is a true weight of the growing crystal and the tare, $W_2$ is the measured weight measured by the second load cell 72, and $w_2$ is a true weight on the load cell 72.

Formulae (8) and (9) are rewritten as follows:

$$\pi \times \Delta P = (w_2 - W_2)/R_2^2 \quad (10)$$
$$= (W_1 - w_1)/R_1^2$$

$$w_1 = W_1 + (W_2 - w_2) \times R_1^2/R_2^2 \quad (11)$$

In formula (11), $R_1$ and $R_2$ are substituted as the following formula:

$$R_1 = k_1 \times R_2 \quad (12)$$

where $k_1$ is a constant. Therefore, $$w_1 = W_1 + (W_2 - w_2) \times k_1^2 \quad (13)$$

$$w_1 = W_1 + k_1^2 \times W_2 + c_1 \quad (14)$$

where $c_1$ is a constant.

Accordingly, with reference to formula (14), accurate weight $w_1$ of the growing crystal and the tare can be calculated from $W_1$ and $W_2$.

On the basis of the estimate of the weight $w_1$, the diameter of the growing single crystal can be controlled accurately and automatically by means of the computer 60 to control the power of the heater 53.

In the above construction and FIG. 3, the detecting bar 70 is provided to the bottom of the outer and inner vessels 20 and 22; and the second load cell 72 is provided beneath the vessels. However, the detecting bar 70 can be installed to the top of the outer and inner vessels 20 and 22; and the second load cell 72 can be equipped above the vessels.

In that case, $w_1$ is calculated as follows:

$$w_1 = W_1 - (W_2 - w_2) \times k_1^2 \quad (15)$$

$$w_1 = W_1 - k_1^2 \times W_2 + c_2 \quad (16)$$

where $c_2$ is a constant.

EXAMPLE 2

An experiment for obtaining a single crystal was done with the above apparatus shown in FIG. 3 with the pulling-up speed of the upper shaft 36 at 5 mm/hour, the rotation speed of the upper shaft 36 at 5 r.p.m., and the rotation speed of the lower shaft 30 at 5 r.p.m.

The produced single crystal was of a 80 mm diameter and of a 100 mm length. The deviation of the diameter was small, in a range of ±1 mm.

What is claimed is:

1. A method for monocrystaline growth of dissociative compound semiconductor, the method including the steps of:
   (a) preparing a first volatile component material and second material of the dissociative compound semiconductor, the first material being placed on the bottom of an air-tight vessel, the second material being contained in a crucible in the air-tight vessel, the crucible supported by a lower shaft extending from the inside to the outside of the air-tight vessel;
   (b) heating the first material for evaporating the first material to make the first material react with the second material in the crucible, thereby synthesizing the dissociative compound semiconductor in the crucible;
   (c) adjusting the temperature of a furnace installed on the air-tight vessel so as to control the pressure of a gas including the first volatile component material in the air-tight vessel; and
   (d) pulling up a single crystal from said melt by an upper shaft, the upper shaft extending from inside to outside of the air-tight vessel, thereby growing the single crystal; said method characterized in that said pulling-up step comprises the steps of:
   (e) measuring the weight of the growing crystal, the weight influenced by a difference between the interior pressure of the inner vessel and a pressure outside of the inner vessel;
   (f) correcting the measured weight of the crystal for the error due to the pressure difference, thereby obtaining an accurate estimate of the weight of the crystal; and
   (g) controlling a diameter of said growing crystal on the basis of said weight estimate of the crystal.

2. A method according to claim 1, wherein said controlling step comprises controlling a heating means, the heating means producing an adequate temperature distribution in the air-tight vessel, thereby controlling the diameter of the growing crystal.

3. A method according to claim 2, wherein said upper shaft and said lower shaft are of circular cross sections, the upper shaft and the lower shaft having different diameters from each other, a first load cell being connected to the upper shaft, a second load cell being connected to the lower shaft, said measuring step being done by the first load cell.

4. A method according to claim 3, wherein said second load cell detects the weight of the melt in said crucible, the weight being influenced by a difference between the interior pressure of the air-tight vessel and a pressure outside of the inner vessel.

5. A method according to claim 2, wherein a detecting bar penetrates air-tightly the wall of the air-tight vessels, a first load cell being connected to the upper shaft, a second load cell being connected to the detecting bar, said measuring step being done by the first load cell.

6. A method according to claim 5, wherein said second load cell detects the weight supported by the detecting bar, the weight supported by the detecting bar being influenced by a difference between the interior pressure of the inner vessel and a pressure outside of the inner vessel.

7. An apparatus for monocrystaline growth of dissociative compound semiconductor, the apparatus comprising:

(a) an outer air-tight vessel having a top and bottom wall;

(b) an inner air-tight vessel placed in the outer vessel, the inner vessel having a top and bottom wall;

(c) a furnace installed on the inner air-tight vessel for controlling the pressure of a gas including a first volatile component material of the dissociative compound semiconductor;

(d) a lower shaft of a circular cross section, the lower shaft having an axis in a vertical direction, the lower shaft being movable in a vertical direction and rotatable about the axis thereof, the lower shaft penetrating air-tightly the bottom walls of the outer and inner vessels in a vertical direction;

(e) a crucible for containing a second component material of the dissociative compound semiconductor in which a melt of the dissociative compound is synthesized by reaction with said gas of said first material, the crucible disposed in the inner vessel and supported by the lower shaft;

(f) heating means being adequate to give a desirable temperature distribution of the inner vessel; temperature distribution of the inner vessel;

(g) an upper shaft for pulling a single crystal upward from said melt of the dissociative compound, thereby growing the single crystal, the upper shaft being of a circular cross section having an axis in a vertical direction, the upper shaft being movable in a vertical direction and rotatable about the axis thereof, the upper shaft penetrating air-tightly the top walls of the outer and inner vessels in a vertical direction above the crucible;

(h) a first load cell disposed on the outer vessel for detecting the weight of the growing crystal, the weight being influenced by a difference between the interior pressure of the inner vessel and a pressure outside of the inner vessel; and (i) a second load cell disposed on the outer vessel for correcting the weight of the growing crystal for the error due to the pressure difference, thereby correcting the weight of the growing crystal.

8. An apparatus according to claim 7, wherein said upper shaft and said lower shaft have different diameters from each other, said first load cell being connected to the upper shaft, said second load cell being connected to the lower shaft.

9. An apparatus according to claim 8, wherein said second load cell detects the weight of the melt in said crucible, the weight being influenced by a difference between the interior pressure of the inner vessel and a pressure outside of the inner vessel.

10. An apparatus according to claim 7, wherein said apparatus further comprises a detecting bar penetrating air-tightly the walls of the outer and inner vessels, said first load cell being connected to the upper shaft, said second load cell being connected to the detecting bar.

11. An apparatus according to claim 10, wherein said second load cell detects the weight supported by the detecting bar, the weight being influenced by a difference between the interior pressure of the inner vessel and a pressure outside of the inner vessel.

* * * * *